United States Patent
Parthasarathy et al.

(10) Patent No.: US 7,871,882 B2
(45) Date of Patent: Jan. 18, 2011

(54) METHOD OF FABRICATING A DEEP TRENCH INSULATED GATE BIPOLAR TRANSISTOR

(75) Inventors: Vijay Parthasarathy, Mountain View, CA (US); Sujit Banerjee, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 275 days.

(21) Appl. No.: 12/317,297

(22) Filed: Dec. 20, 2008

(65) Prior Publication Data

US 2010/0159649 A1   Jun. 24, 2010

(51) Int. Cl.
*H01L 21/8249* (2006.01)
(52) U.S. Cl. .................. 438/235; 438/236; 438/309
(58) Field of Classification Search ............. 438/235, 438/236, 270, 309, 316, 336, 359, 360
See application file for complete search history.

(56) References Cited

U.S. PATENT DOCUMENTS

| | | | |
|---|---|---|---|
| 6,838,346 B2* | 1/2005 | Disney | 438/270 |
| 7,253,042 B2* | 8/2007 | Disney | 438/197 |
| 7,648,879 B2* | 1/2010 | Banerjee et al. | 438/270 |
| 2002/0074585 A1* | 6/2002 | Tsang et al. | 257/302 |
| 2004/0063269 A1* | 4/2004 | Kocon | 438/206 |
| 2004/0097042 A1* | 5/2004 | Hshieh et al. | 438/270 |

* cited by examiner

*Primary Examiner*—Kevin M Picardat
(74) *Attorney, Agent, or Firm*—The Law Offices of Bradley J. Bereznak

(57) ABSTRACT

In one embodiment, a method comprises forming an epitaxial layer over a substrate of an opposite conductivity type, the epitaxial layer being separated by a buffer layer having a doping concentration that is substantially constant in a vertical direction down to the buffer layer. A pair of spaced-apart trenches is formed in the epitaxial layer from a top surface of the epitaxial layer down at least into the buffer layer. A dielectric material is formed in the trenches over the first and second sidewall portions. Source/collector and body regions of are formed at the top of the epitaxial layer, the body region separating the source/collector region of the pillar from a drift region of the epitaxial layer that extends from the body region to the buffer layer. An insulated gate member is then formed in each of the trenches adjacent to and insulated from the body region.

26 Claims, 7 Drawing Sheets

METHOD OF FABRICATING A DEEP TRENCH INSULATED GATE BIPOLAR TRANSISTOR

TECHNICAL FIELD

The present disclosure relates to power semiconductor device structures and processes for fabricating high-voltage transistors.

BACKGROUND

High-voltage, field-effect transistors (HVFETs) and other varieties of high voltage power semiconductor devices are well known in the semiconductor arts. Many HVFETs employ a device structure that includes a lightly-doped extended drain region that supports or blocks the applied high-voltage (e.g., several hundred volts) when the device is in the "off" state. Because of the high-resistivity epitaxial layer, the "on" state drain-source resistances ($R_{DS(on)}$) of ordinary MOSFET power devices operating at high voltages (e.g., 500-700V or higher) is typically large, especially at high drain currents. For instance, in a traditional power MOSFET the lightly-doped extended drain region, also referred to as the drift zone, is typically responsible for 95% of total on-state resistance of the transistor.

To combat the conduction loss problem, various alternative design structures have been proposed. For example, in the vertical, thin silicon (VTS) MOSFET the conduction loss is lowered by employing a graded doping profile in a thin silicon layer which is depleted by a field plate embedded in an adjacently located thick oxide. One problem with the VTS structure, however, is the relatively large output capacitance (Coss) caused by the large field plate (coupled to the source terminal) to silicon pillar (coupled to the drain terminainal) overlap. This relatively large output capacitance limits the high frequency switching performance of the device. Another drawback to the traditional VTS MOSFET structure is the need for a linearly-graded doping profile in the vertical direction through the drift regions, which is often difficult to control and costly to manufacture.

In another approach, known as the CoolMOS™ concept, conduction loss is reduced by alternating N− and P− reduced surface field (RESURF) layers. In a CoolMOS™ device electrical conductivity is provided by majority carriers only; that is, there is no bipolar current (minority carrier) contribution. Due to the fact that the CoolMOS™ high-voltage power MOSFET design does not include a large trench field plate structure, it also benefits from a relatively low Coss. Nevertheless, in certain applications the CoolMOS™ design still suffers from unacceptably high conductivity losses.

The insulated-gate bipolar transistor, or IGBT, is a minority carrier power semiconductor device that achieves relatively low conduction losses through a FET control input in combination with a bipolar power switching transistor in a single device structure. The main drawback of the IGBT design, however is that switching frequency is typically limited to 60 KHz or lower due to a characteristic "tail current" resulting from minority carrier buildup in the epitaxial drift region. Stated differently, switching losses caused by poor switching performance at higher frequencies (100 KHz or higher) remains problematic. Attempts aimed at improving the switching speed of the IGBT design include the use of ultra-thin wafer (~75 μm or less) non-punchthrough structures. But ultra-thin wafer processing comes with significant cost addition and added complexity in fabrication processing.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

DETAILED DESCRIPTION

In the following description specific details are set forth, such as material types, dimensions, structural features, processing steps, etc., in order to provide a thorough understanding of the present invention. However, persons having ordinary skill in the relevant arts will appreciate that these specific details may not be needed to practice the present invention. It should also be understood that the elements in the figures are representational, and are not drawn to scale in the interest of clarity.

Figure 1:
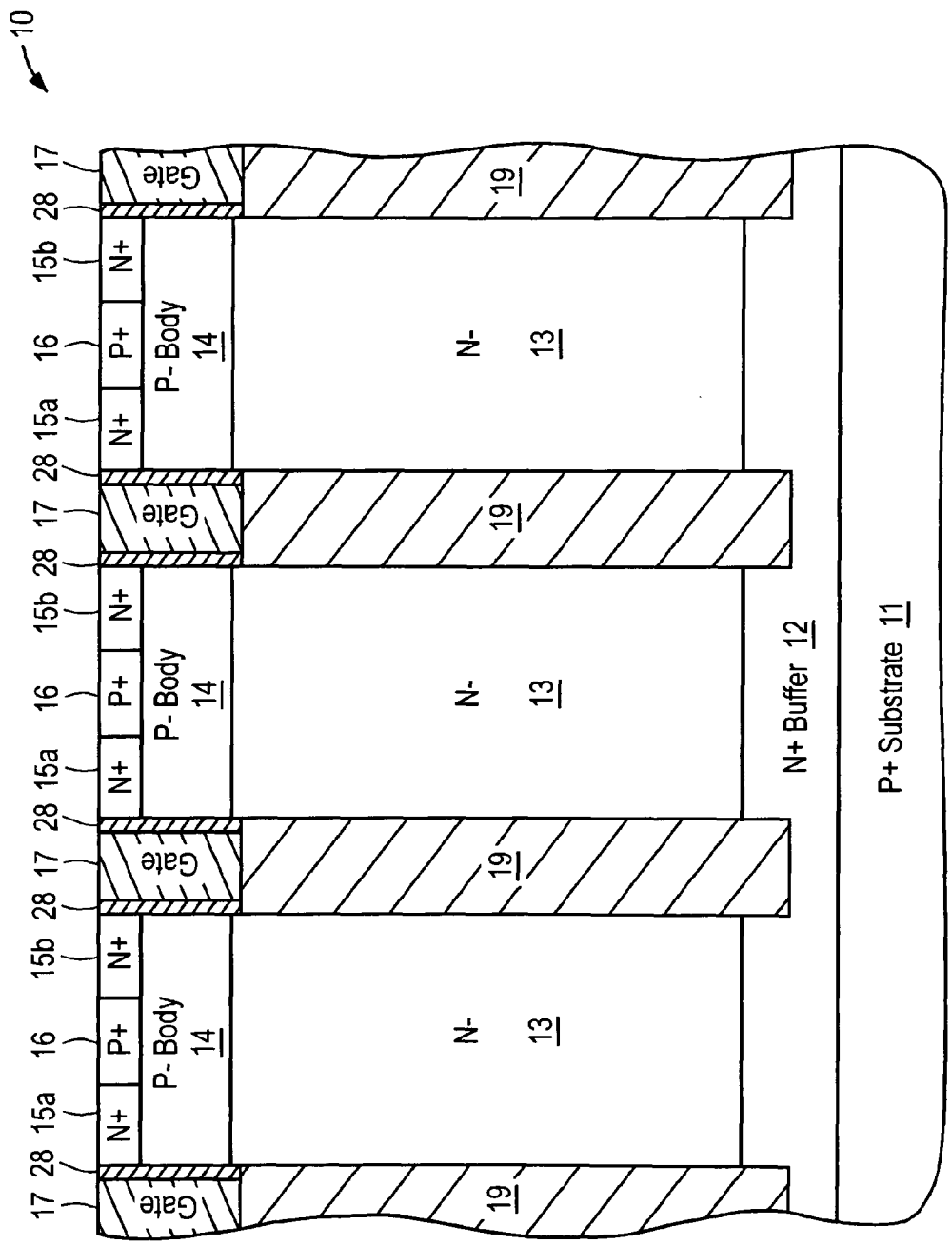
FIG. 1 illustrates an example cross-sectional side view of a deep trench insulated gate bipolar transistor (IGBT) structure.

FIG. 1 illustrates an example cross-sectional side view of a deep trench IGBT 10 having a structure that includes a plurality of segregated extended drain regions 13 of N-type silicon formed above a P+ doped silicon substrate 11. In the example of FIG. 1, extended drain regions 13 are separated from P+ substrate 11 by a heavily-doped N+ buffer layer 12. In one embodiment, extended drain regions 13 are part of an epitaxial layer that extends from N+ buffer layer 12 to a top surface of the silicon wafer. Substrate 11 is heavily doped to minimize its resistance to current flowing through to the drain electrode, which is located on the bottom of substrate 11 in the completed device.

Deep trench IGBT 10 also includes P-body regions 14. A pair of N+ doped source regions 15a & 15b are laterally separated by a P-type region 16 at the top surface of the wafer's epitaxial layer above each P-body region 14. As can be seen, each P-body region 14 is disposed directly above and vertically separates a corresponding one of the extended drain regions 13 from N+ source regions 15a & 15b and P-type region 16. The device structure of FIG. 1 further includes a trench gate structure having a gate 17 (comprised, for example, of polysilicon), and a gate-insulating layer 28 that insulates gate 17 from the adjacent sidewall P-body regions 14. Gate-insulating layer 28 may comprise thermally-grown silicon dioxide or another appropriate dielectric insulating material. In a completely manufactured device, application of an appropriate voltage potential to gate 17 causes a conductive channel to be formed along the vertical sidewall portion of P-body regions 14 such that current may flow vertically through the semiconductor material, i.e., from P+ substrate 11 up through buffer layer 12 and extended drain regions 13, through the vertically-formed conduction channel to a top surface of the silicon wafer where source regions 15 are disposed.

In another embodiment, instead of arranging P+ region 16 between N+ source regions 15a & 15b across the lateral width of the semiconductor pillar (as shown in FIG. 1), N+ source regions 15 and P+ regions may be alternately formed at the top of each pillar across the lateral length (i.e., into and out of the page of the illustrative figures) of each pillar. In other words, a given cross-sectional view such as that shown in FIG. 1 would have either an N+ source region 15, or a P+ region 16, that extends across the full lateral width of pillar 17, depending upon where the cross-section is taken. In such an embodiment, each N+ source region 15 is adjoined on both sides (along the lateral length of the pillar) by P+ regions 16. Similarly, each P+ region 16 is adjoined on both sides (along the lateral length of the pillar) by N+ source regions 15.

Practitioners in the art will appreciate that P+ substrate 11 also functions as the P+ emitter layer of a vertical PNP bipolar junction transistor. Expressed in fundamental terms, deep trench IGBT 10 comprises a semiconductor device with four layers of alternating PNPN conductivity type (P+ substrate 11—N+ buffer layer 12 & N− extended drain regions 13—P-Body regions 14—N+ source regions 15) that is controlled by the trench gate MOSFET structure described above. Practitioners in the art will further appreciate that the inclusion of N+ buffer layer 12 advantageously prevents the off-state depletion layer formed in drift regions 13 from reaching the P+ emitter (substrate) layer 11 during high voltage blocking.

Extended drain regions 13, P-body regions 14, source regions 15a & 15b and P+ regions 16 collectively comprise a mesa or pillar (both terms are used synonymously in the present application) of silicon material in the example device structure of FIG. 1. As will be described below in conjunction with FIGS. 3A-3F, the pillars are defined by vertical trenches formed by selective removal of regions of semiconductor material on opposite sides of each pillar or mesa. The height and width of each of the pillars, as well as the spacing between adjacent vertical trenches may be determined by the breakdown voltage requirements of the device. In various embodiments, the pillars have a vertical height (thickness) in a range of about 30 μm to 120 μm thick. For example, a deep trench IGBT formed on a die approximately 1 mm×1 mm in size may have a pillar with a vertical thickness of about 60-65 μm, with N− extended drain region 13 comprising about 50 μm and N+ buffer layer 12 comprising approximately 10-15 μm of the total vertical thickness. By way of further example, a transistor structure formed on a die of about 2 mm-4 mm on each side may have a pillar structure of approximately 30 μm thick. In certain embodiments, the lateral width of each pillar is as narrow as can be reliably manufactured (e.g., about 0.4 μm to 0.8 μm wide) in order to achieve a very high breakdown voltage (e.g., 600-800V).

In yet another alternative embodiment, N+ buffer layer may be omitted from the device structure. Note, however, that elimination of N+ buffer layer 12 means that the vertical thickness (pillar height) of N− extended drain regions 13 may need to be substantially increased (e.g., 100-120 μm) to support a required blocking voltage.

Adjacent pairs of pillars (which comprise N− extended drain regions 13) are shown separated in the lateral direction by a deep trench dielectric region 19. Dielectric regions 19 may comprise silicon dioxide, silicon nitride, or other suitable dielectric materials. Following formation of the deep trenches, dielectric regions 19 may be formed using a variety of well-known methods, including thermal growth and chemical vapor deposition. In the example of FIG. 1, each of dielectric regions 19 extend from just beneath gate 17 down into N+ buffer layer 12. In other words, in the embodiment shown, dielectric regions 19 extend substantially vertically through the entire vertical thickness of drift regions 13.

Figure 2:
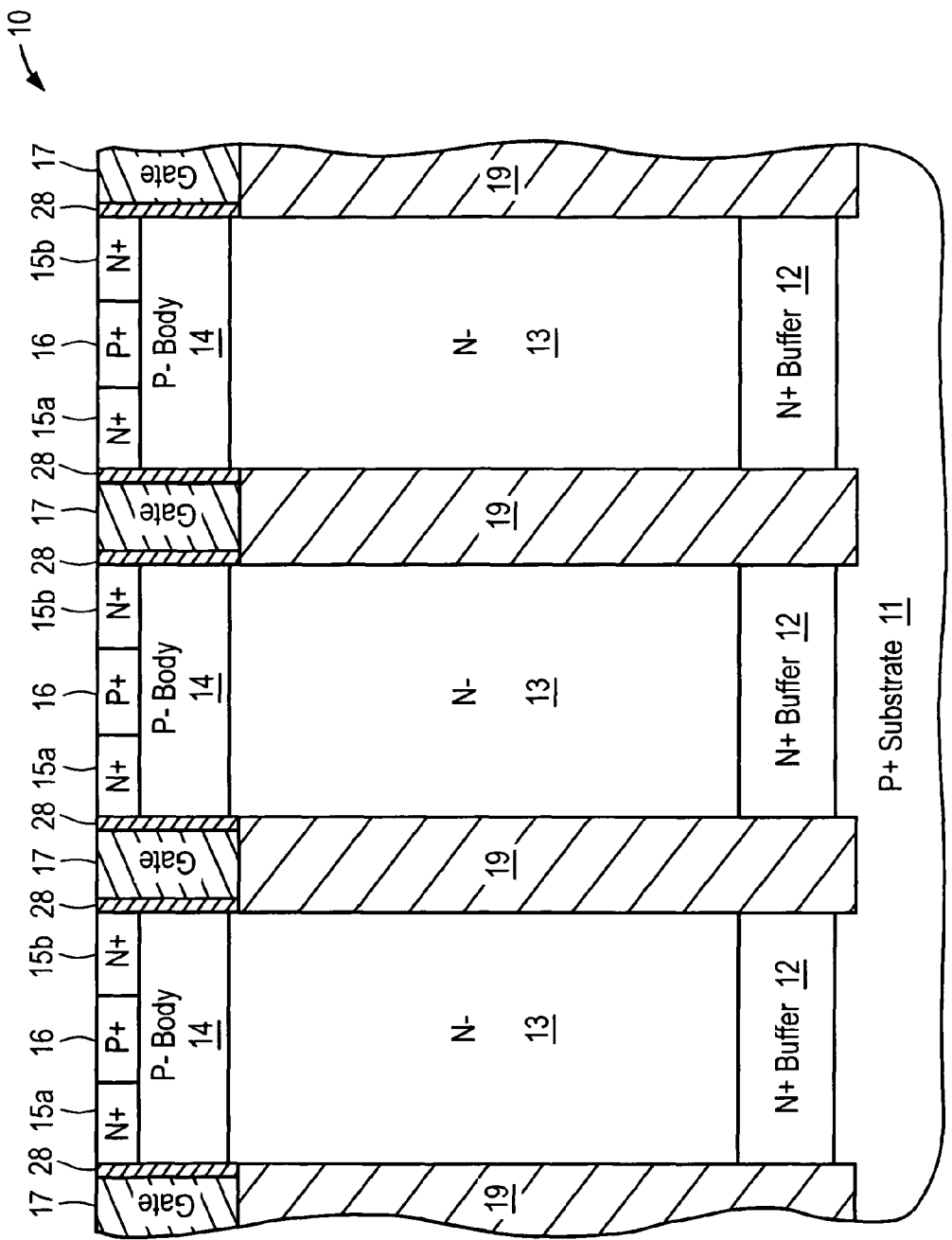
FIG. 2 illustrates an example cross-sectional side view of another deep trench insulated gate bipolar transistor (IGBT) structure.

In the example embodiment shown in FIG. 2, dielectric regions 19 vertically extend through N+ buffer region 12 into P+ substrate 11.

In one embodiment, the lateral width of each dielectric region 19 that separates the sidewalls of adjacent drift regions 13 is approximately 2 μm. In a specific embodiment, the lateral width of each drift region and each dielectric region is equal to 2 μm, for a 1:1 width ratio. Alternative embodiments may be manufactured with a width ratio (drift region to dielectric region) in a range from 0.2 to 6.0.

Persons of skill in the art will understand that during forward (on-state) conduction, the resistance of N− drift regions 13 is considerably reduced by injection of minority carriers (holes) from P+ emitter layer 11 of the bipolar device into drift regions 13. These injected minority carriers typically take time to enter and exit (recombine) drift regions 13 when switching the deep trench IGBT on and off. In the example device structures shown in FIGS. 1 and 2, recombination (also referred to as "lifetime killing") of minority carriers is accomplished through the numerous interface traps created along the large sidewall region formed by the interface of N− drift regions 13 with dielectric (e.g., oxide) regions 19. For instance, when the device is switched from the on-state (forward conduction) to the off-state (blocking voltage) the interface traps along the sidewall areas of N− drift regions 13 effectively aid in rapidly sweeping out the minority carriers from drift regions 13, thereby improving high speed switching performance of the device.

It should be appreciated that because the deep trench IGBT device structure does not include conductive field plates within dielectric regions 19—that is, the trench is completely filled with oxide or some other suitable dielectric—the doping profile of the N− drift regions 13 may be substantially constant.

Figure 3A:
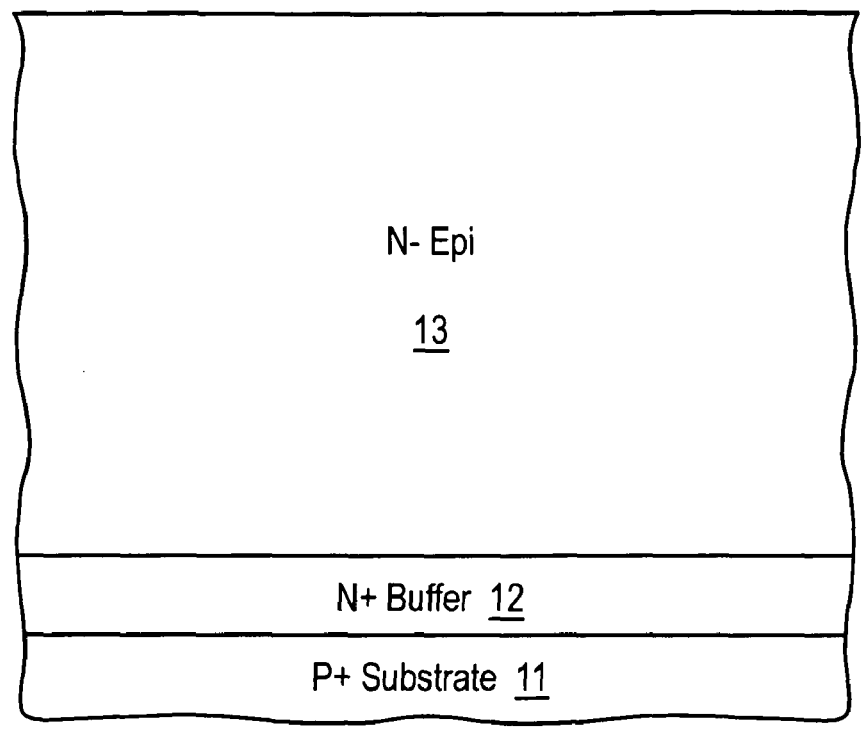
FIG. 3A illustrates an example cross-sectional side view of a deep trench IGBT structure in a fabrication process after the initial step of forming N−doped epitaxial layers on a P+ substrate.

Each of FIGS. 3A-3G is a cross-sectional side views that illustrates an example deep trench IGBT structure taken at various stages in an example fabrication process. This fabrication process shown by these figures may be used not only to form the device of FIG. 1, but also the deep trench IGBT device structure shown in FIG. 2. To begin with, FIG. 3A illustrates an example cross-sectional side view of a deep trench IGBT structure in a fabrication process after the initial step of forming N-doped layers 12 and 13 over a P+ silicon substrate 11. In one embodiment, N+ buffer layer 12 has a vertical thickness in a range about 10-15 μm thick. The N+ layer 11 is heavily doped to minimize its resistance to current flowing through to the drain (emitter) electrode, which is located on the bottom of the substrate in the completed device. Heavy doping of N+ buffer layer 12 also prevents punchthough to P+ substrate 11 during reverse bias voltage blocking. Doping of layer 12 may be carried out as the layer is being formed. Doping of N− epitaxial layer 13 may also be carried out as the layer is being formed.

Figure 4:
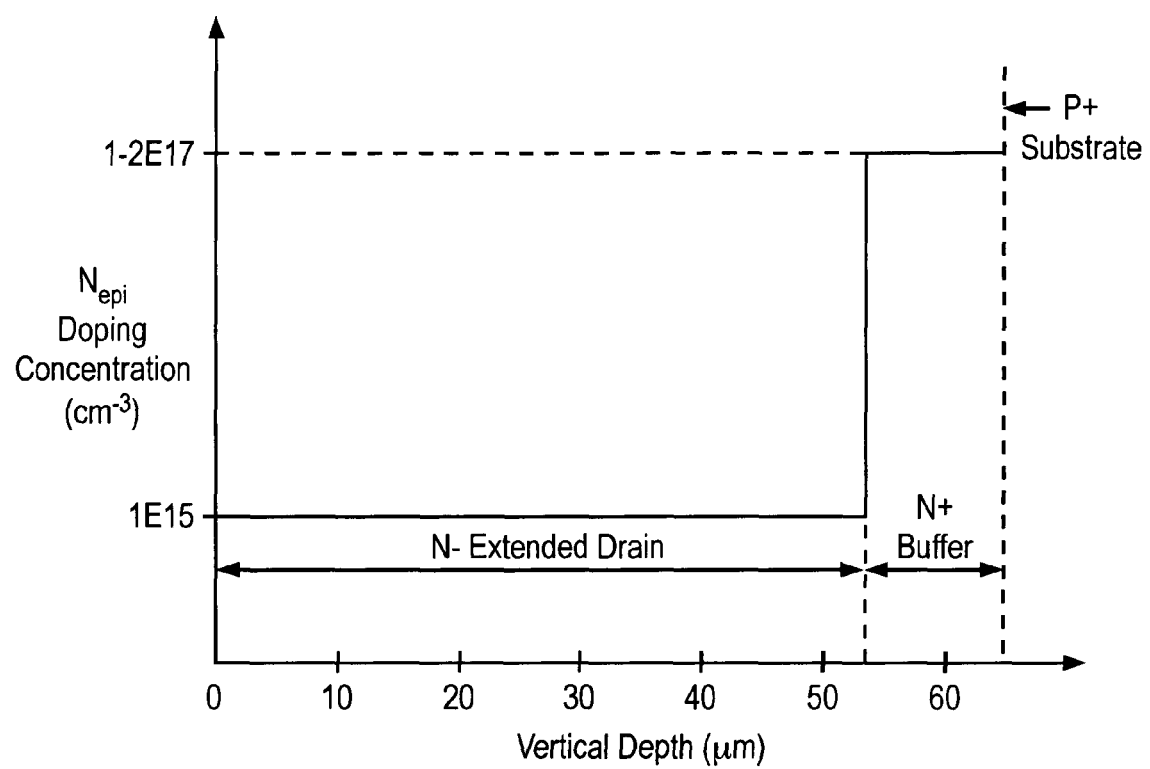
FIG. 4 is a plot of epitaxial layer doping profile versus normalized distance for an example deep trench IGBT device structure, such as that shown in FIG. 1.

FIG. 4 is a plot of epitaxial layer doping profile versus normalized distance for an example deep trench IGBT device structure, such as that shown in FIG. 1. As can be seen, the doping profile concentration of the N-type epitaxial layer is substantially flat with a relatively low concentration of about $1 \times 10^{15}$ cm$^{-3}$. At a vertical depth of about 54 μm, where the N+ buffer layer begins, the doping profile concentration abruptly increases (stepped increase) to a concentration of about $2 \times 10^{17}$ cm$^{-3}$.

Figure 3B:
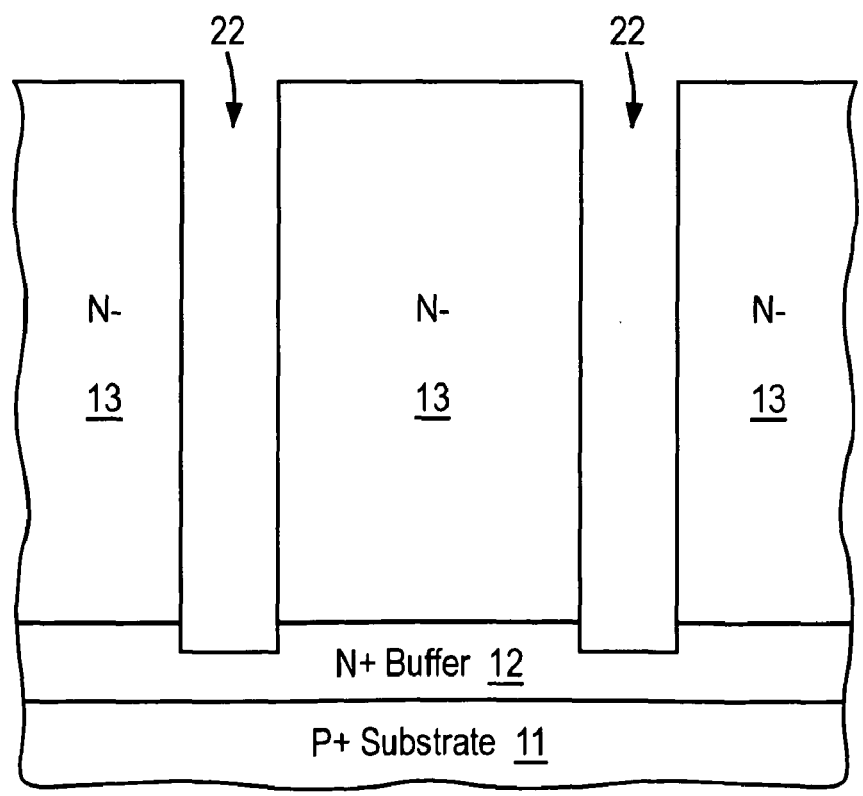
FIG. 3B illustrates the example device structure of FIG. 3A following vertical deep trench etching.

After layers 12 & 13 have been formed, the top surface of the semiconductor wafer is appropriately masked and deep vertical trenches 22 are then etched into N− epitaxial layer 13. FIG. 3B illustrates an example cross-sectional side view of a deep trench IGBT in a fabrication process following vertical trench etching that forms silicon pillars or mesas of N− doped semiconductor material segregated by deep trenches 22. The height and width of each pillar, as well as the spacing between adjacent vertical trenches 22 may be determined by the breakdown voltage requirements of the device. As described previously, these segregated pillars of epitaxial material 13 eventually form the N-type extended drain or drift regions of the final deep trench IGBT device structure.

It should be understood that each pillar, in various embodiments, may extend a considerable lateral distance in an orthogonal direction (into and out of the page). In certain embodiments, the lateral width of the N-type drift region formed by each pillar is as narrow as can be reliably manufactured in order to achieve a very high breakdown voltage (e.g., 600-800V).

Furthermore, it should be understood that although the example of FIG. 1 illustrates a cross section having three pillars or columns of semiconductor material that includes three segregated N− drift regions, it should be understood that this same device structure may be repeated or replicated many times in both lateral directions over the semiconductor die in a completely fabricated device. Other embodiments may optionally include additional or fewer semiconductor regions. For example, certain alternative embodiments may comprise a drift region with a doping profile that varies from top to bottom. Other embodiments may include multiple abrupt (i.e., stepped) variations in lateral width of the semiconductor material that forms the segregated pillars (e.g., N− drift regions). For instance, drift regions 13 may be fabricated wider near the top surface of the silicon wafer and wider nearest the N+ buffer layer 12.

Figure 3C:
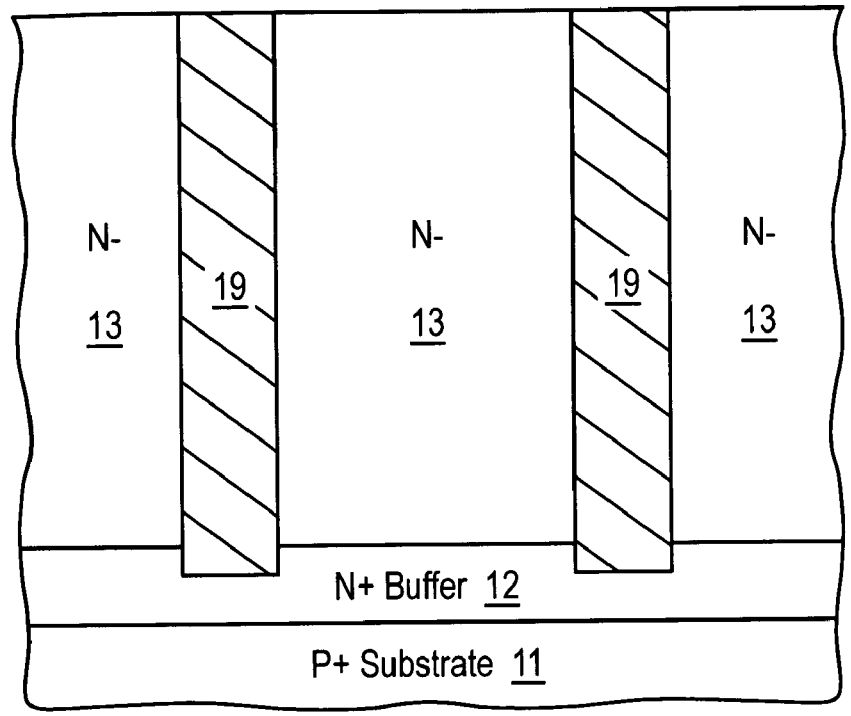
FIG. 3C illustrates the example device structure of FIG. 3B after formation of a dielectric region that fills the deep vertical trenches.

FIG. 3C illustrates the example device structure of FIG. 3B after trenches 22 have been filled with a dielectric material (e.g., oxide) thereby forming dielectric regions 19. The dielectric material covers the sidewalls of each of the epitaxial layer pillars and completely fills each of the trenches 22. The dielectric layer preferably comprises silicon dioxide, though silicon nitride or other suitable dielectric materials may also be used. Dielectric regions 19 may be formed using a variety of well-known methods, including thermal growth and chemical vapor deposition. Following formation of regions 19, the top surface of the silicon substrate may be planarized utilizing conventional techniques such as chemical-mechanical polishing.

Figure 3D:
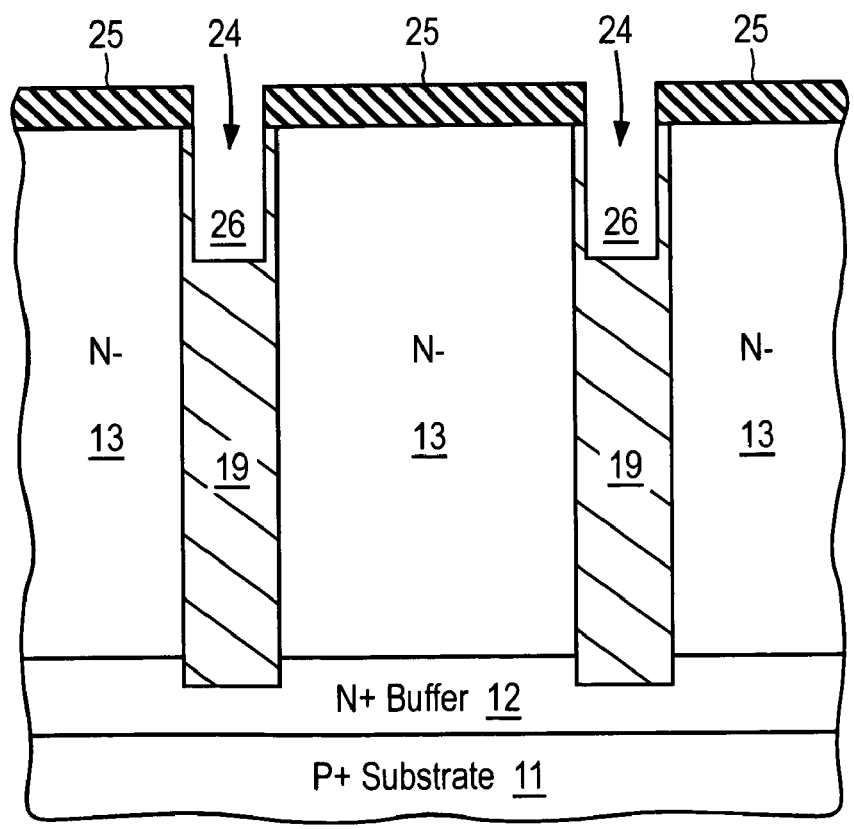
FIG. 3D illustrates the example device structure of FIG. 3C after masking of a top surface of the silicon substrate, which is then followed by a first dielectric etch.

FIG. 3D illustrates the example device structure of FIG. 3C after masking of a top surface of the silicon substrate. In this example, the masking layer 25 comprises a layer of photoresist with developed openings 24 centered over oxide regions 19. Note that the portion of masking layer 21 directly above each pillar of epitaxial region 13 extends or overlaps a short distance beyond the edge of the sidewall portion of the pillar. This has the effect of leaving a thin layer of sidewall oxide that covers first and second sidewall portions of oxide regions 19. That is, the edge of each opening 24 closest to each N-epi pillar 13 is not coincident with the sidewall; rather, openings 24 are intentionally offset so that the nearest edge of each opening 24 is a small distance away from the corresponding pillar sidewall. In one embodiment, the overlap distance is approximately 0.2 μm to 0.5 μm.

Gate trenches 26 are formed by a first dielectric etch that removes the dielectric material of regions 19 in the areas directly below openings 24. In one embodiment, the first dielectric etch is a plasma etch that is substantially anisotropic. The first dielectric etch is performed down to the desired or target depth, which is about 3 μm deep in one embodiment. A mixture of $C_4F_8/CO/Ar/O_2$ gases, for example, may be utilized for the plasma etch. Note that the anisotropic nature of the first etch produces a substantially vertical sidewall profile in the gate trench that does not extend or penetrate to the sidewalls of each pillar 13. Stated differently, the overlap distance of masking layer 25 is such that anisotropic etching through openings 24 does not attack the sidewalls of N-epi pillars 13; instead, a portion of the dielectric material comprising oxide regions 19 still remains covering the sidewall areas of pillars 13 after the first dielectric etch.

Figure 3E:
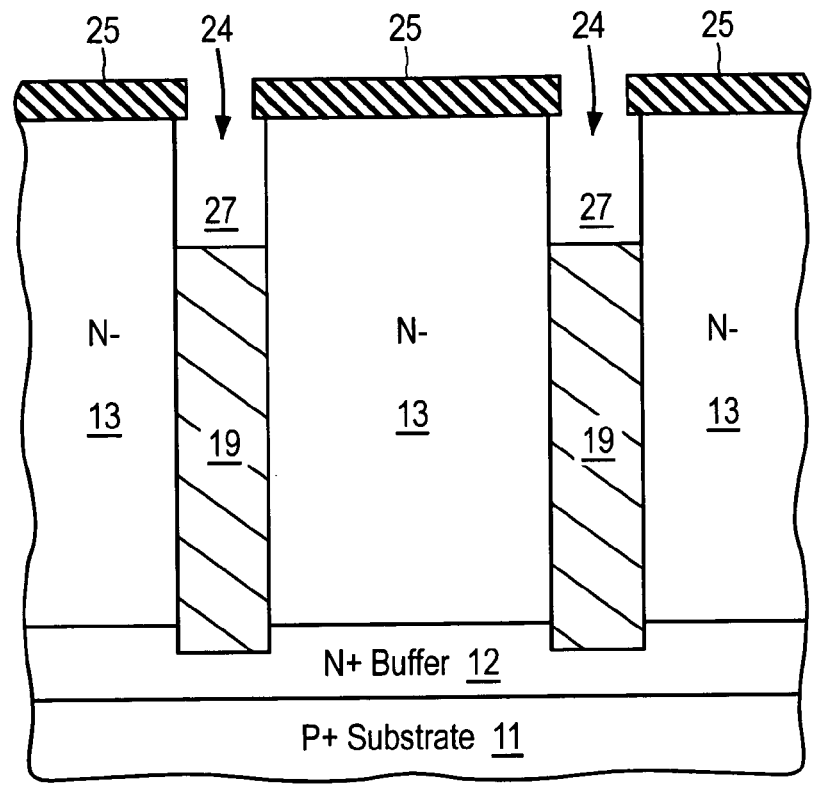
FIG. 3E illustrates the example device structure of FIG. 3D after a second dielectric etch that forms the gate trenches.

FIG. 3E illustrates the example device structure of FIG. 3D following removal of the oxide covering the sidewalls of N-epi pillars 13 in the gate trenches. A second dielectric etch may performed through openings 24 of masking layer 25 to completely remove the remaining oxide on the sidewalls of the N-epi pillars. In one embodiment, the second dielectric etch is a wet etch (e.g., using buffered HF) that is substantially isotropic in nature. The result is a pair of gate trench openings 27 that expose the epitaxial silicon material along sidewalls of the pillar or mesa.

In the embodiment shown, the second dielectric etch is highly selective, which means that it etches the dielectric material at a much faster rate than it etches silicon. Using this process, the silicon surface of each sidewall is undamaged, thereby allowing a high-quality gate oxide to be subsequently grown on the sidewall surface. In addition, due to the substantially isotropic nature of the second dielectric etch the gate trench is etched at a similar rate in both the vertical and lateral directions. However, as the second dielectric etch is utilized to remove the remaining few tenths of a micron of silicon dioxide on the silicon mesa sidewall, the overall effect on the aspect ratio of trench gate openings 27 is relatively insignificant. In one embodiment, the lateral width of each gate trench opening 27 is approximately 1.5 μm wide, and the final depth is approximately 3.5 μm.

Figure 3F:
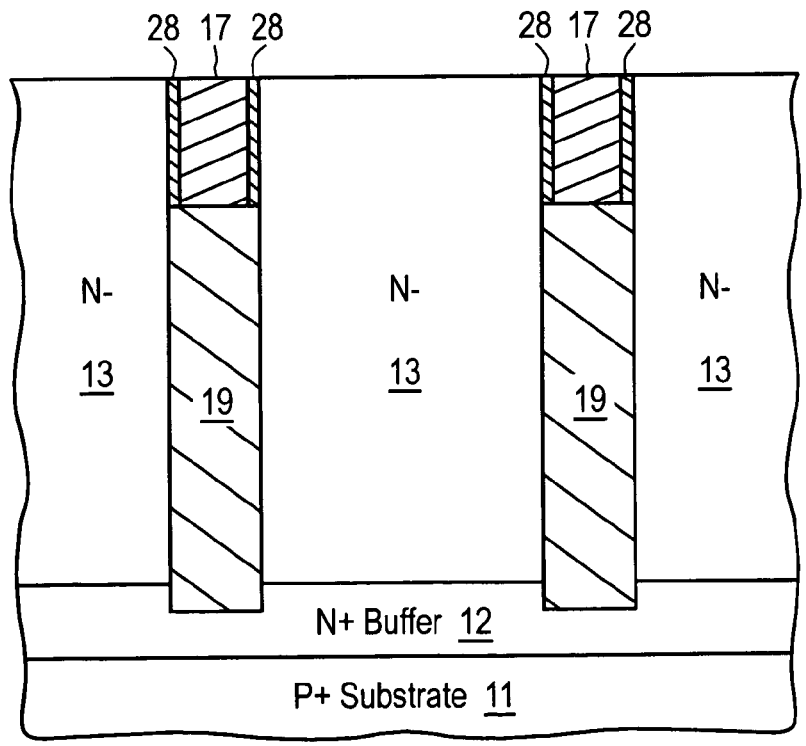
FIG. 3F illustrates the example device structure of FIG. 3E following formation of the trench gate structure in the gate trenches.

FIG. 3F illustrates the example device structure of FIG. 3E after removal of the masking layer 25, formation of a high-quality, thin (e.g., ~500 Å) gate oxide layer 28, which covers the exposed sidewalls portions of N-epi pillar 13, and subsequent filling of the gate trenches. In one embodiment, gate oxide layer 28 is thermally grown with a thickness in the range of 100 to 1000 A. Masking layer 25 is removed prior to formation of gate oxide 28. The remaining portion of each gate trench is filled with doped polysilicon or another suitable material, which form gate members 17 in the completed deep trench IGBT device structure. In one embodiment, each gate member 17 has a lateral width of approximately 1.5 μm and a depth of about 3.5 μm.

Practitioners in the art will appreciate that the overlap distance of the masking layer should be sufficiently large enough such that even under a worst-case mask misalignment error scenario, the resulting overlap of masking layer 25 with respect to the sidewall of each N-epi pillar 13 still prevents the plasma etch from attacking the silicon material along either one of opposing pillar sidewalls. Similarly, the overlap distance of masking layer 25 should not be so large such that in a worst-case mask misalignment scenario the oxide remaining on either one of sidewalls 19 cannot be removed by a reasonable second dielectric etch.

Figure 3G:
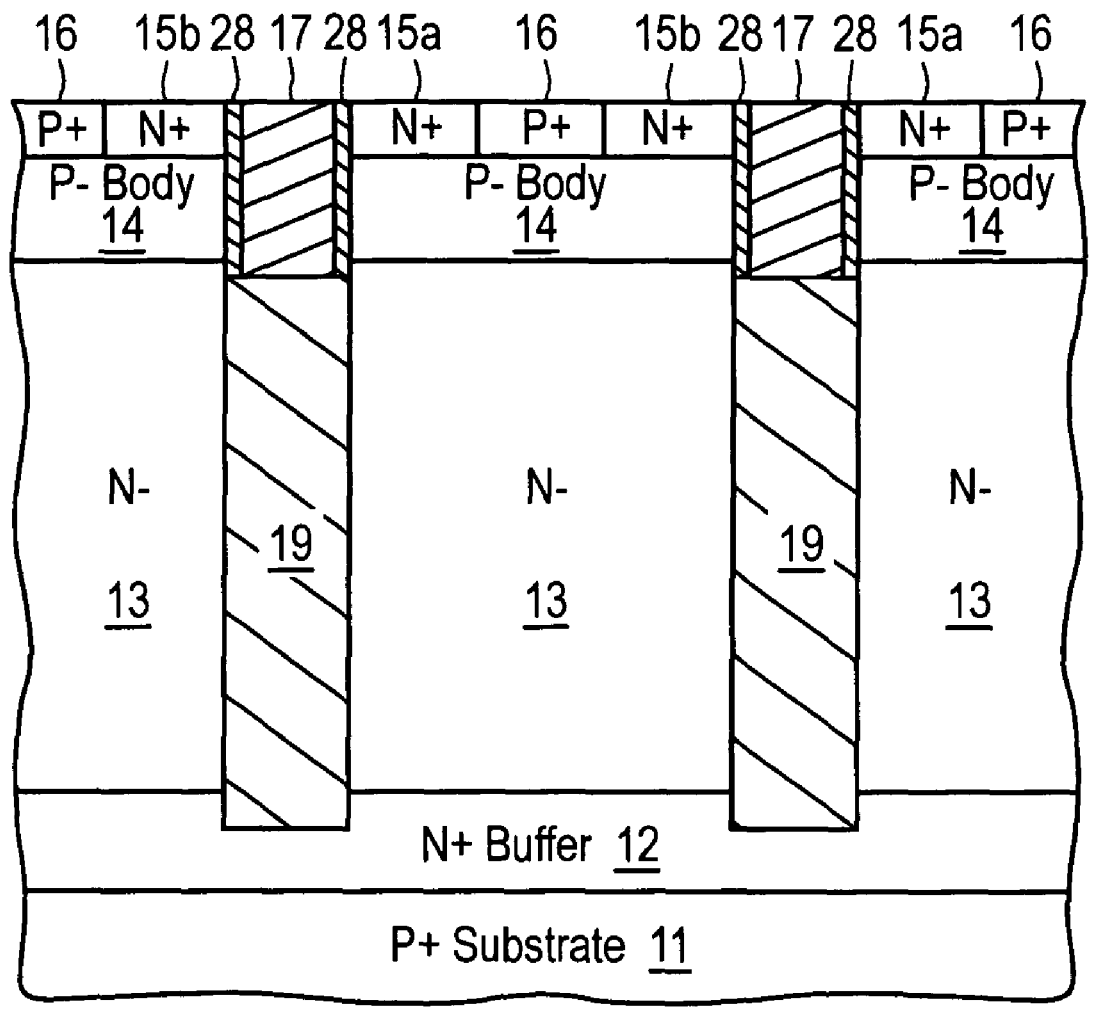
FIG. 3G illustrates the example device structure of FIG. 3F after formation of the source (collector) and body regions.

FIG. 3G illustrates the example device structure of FIG. 3F after formation of the N+ source (collector) regions 15a & 15b and P-body region 14 near the top of each N− drift region 13. Source regions 15 and P-body region 14 may each be formed using ordinary deposition, diffusion, and/or implantation processing techniques. After formation of the N+ source regions 15, the transistor device may be completed by forming source (collector), drain (emitter), and MOSFET gate electrodes that electrically connect to the respective regions/materials of the device using conventional fabrication methods (not shown in the figures for clarity reasons).

Although the above embodiments have been described in conjunction with a specific device types, those of ordinary skill in the arts will appreciate that numerous modifications and alterations are well within the scope of the present invention. For instance, although various deep trench IGBTs have been described, the methods, layouts and structures shown are equally applicable to other structures and device types, including Schottky, diode, MOS and bipolar structures. Accordingly, the specification and drawings are to be regarded in an illustrative rather than a restrictive sense.

We claim:

1. A method for fabricating a power transistor device comprising:
    forming a buffer layer of a first conductivity type on a substrate of a second conductivity type opposite to the first conductivity type, the buffer layer having a top surface, a first thickness, and a first doping concentration;
    forming an epitaxial layer of the first conductivity type over the buffer layer, the epitaxial layer having a top surface, a second thickness which is greater than the first thickness;
    forming a pair of spaced-apart trenches in the epitaxial layer that define a pillar which comprises the epitaxial layer, the pillar having first and second sidewall portions, and a first lateral width, the trenches extending in the vertical direction from the top surface of the epitaxial layer down to a bottom that extends beyond the top surface of the buffer layer, the trenches having a second lateral width;
    forming a dielectric material in the trenches that covers each of the first and second sidewall portions from at least just beneath the body region down to the bottom;
    forming a body region of the second conductivity type in the pillar;
    forming a first region of the first conductivity type in the pillar, the first region being of the first conductivity type and disposed at the top surface, the body region separating the first region of the pillar from a drift region that extends from the body region to the buffer layer; and
    forming a gate member in each of the trenches at or near the top surface, the gate member being disposed adjacent to and insulated from the body region.

2. The method of claim 1 wherein the substrate comprises an emitter and the first region comprises a collector of a bipolar transistor, the first region also comprising a source and the drift region comprising an extended drain region of a field-effect transistor, application of a voltage potential to the gate member controlling input forward conduction between the emitter and the collector when the power transistor device is in an on-state.

3. The method of claim 1 wherein the second thickness of the epitaxial layer is about three to five times thicker than the first thickness of the buffer layer.

4. The method of claim 1 wherein the first lateral width is substantially equal to the second lateral width.

5. The method of claim 1 wherein the epitaxial layer has a second doping concentration that is substantially constant in a vertical direction from the top surface, the second doping concentration being substantially less than the first doping concentration.

6. The method of claim 1 wherein the first conductivity type is n-type and the second conductivity type is p-type.

7. The method of claim 1 wherein the dielectric material comprises oxide.

8. The method of claim 1 wherein the bottom of the trenches extends in the vertical direction into the substrate.

9. The method of claim 1 wherein the first doping concentration is sufficiently high as compared to the second doping concentration so as to prevent punchthough to the substrate when the power transistor device operates in an off-state with the substrate at a voltage potential of at least 600V relative to the first region.

10. A method for fabricating a power transistor device comprising:
    forming a semiconductor material of a first conductivity type over a substrate of a second conductivity type opposite to the first conductivity type, the semiconductor material including an epitaxial layer and a buffer layer, the buffer layer separating the epitaxial layer from the substrate, the epitaxial layer having a top surface and a first thickness;
    forming a pair of spaced-apart trenches in the epitaxial layer that define a pillar of the semiconductor material, the pillar having first and second sidewall portions, and a first lateral width, the trenches extending in the vertical direction from the top surface of the epitaxial layer down at least into the buffer layer, the trenches having a second lateral width;
    forming a dielectric material in the trenches that covers each of the first and second sidewall portions;
    forming a body region of the second conductivity type in the pillar;
    forming a first region of the first conductivity type in the pillar, the first region being of the first conductivity type and disposed at the top surface, the body region separating the first region of the pillar from a drift region of the epitaxial layer that extends from the body region to the buffer layer; and
    forming a gate member in each of the trenches at or near the top surface, the gate member being disposed adjacent to and insulated from the body region.

11. The method of claim 10 wherein the epitaxial layer has a first doping concentration that is substantially constant in a vertical direction down to the buffer layer buffer, the buffer layer having a second doping concentration that is at least an order of magnitude greater than the first doping concentration of the epitaxial layer.

12. The method of claim 10 wherein the forming of the gate member comprises:
    forming, in a masking layer, first and second openings respectively disposed over the first and second trenches, the masking layer having a portion between the first and second openings that covers the pillar and overlaps a distance beyond each edge of the first and second sidewall portions coincident with a top surface of the pillar;

anisotropically etching the dielectric material in the trenches through the respective first and second openings to create first and second gate trenches; and isotropically etching the first and second dielectric regions in the first and second gate trenches to remove the dielectric material from an areas of each of the first and second sidewall portions that extends from the top surface to a bottom of the body region.

13. The method of claim 12 further comprising:

forming a gate oxide over the areas;

forming the gate member in each of the first and second trenches, the gate member being insulated from the areas by the gate oxide.

14. The method of claim 10 wherein only the dielectric material is present in the trenches adjacent the drift region.

15. The method of claim 12 wherein the dielectric material comprises oxide.

16. The method of claim 10 wherein the first thickness of the epitaxial layer is about three to five times thicker than a second thickness of the buffer layer.

17. The method of claim 10 wherein the first lateral width is substantially equal to the second lateral width.

18. The method of claim 17 wherein the first and second lateral widths are each approximately 2 μm.

19. The method of claim 10 wherein the first conductivity type is n-type and the second conductivity type is p-type.

20. The method of claim 10 wherein the trenches extend in the vertical direction into the substrate.

21. A method for fabricating a power transistor device on a silicon wafer having a thickness of at least 4 mils, comprising:

forming a buffer layer on a substrate of the silicon wafer, the buffer layer having a first thickness and being of a first conductivity type, the substrate being of a second conductivity type opposite to the first conductivity type;

forming an epitaxial layer of the first conductivity type on the buffer layer, the epitaxial layer having a second thickness that is at least three times greater than the first thickness, the epitaxial layer having a substantially constant doping concentration throughout, the buffer layer having a doping concentration that is greater by at least an order of magnitude than the substantially constant doping concentration of the epitaxial layer;

etching trenches in a vertical direction into the silicon wafer, the trenches extending from a top surface of the epitaxial layer down at least into the buffer layer, the trenches defining a plurality of pillars, each pillar having first and second sidewalls and a first lateral width, a ratio of the second thickness to the first lateral width being at least 10:1, each vertical trench having a second lateral width;

filling the trenches with a dielectric material that covers the first and second sidewalls;

forming a body region of the second conductivity type in the pillar, the body region extending across the first lateral width of the pillar between the first and second sidewalls, the body region defining a drift region that separates the body region from the buffer layer;

forming a first region of the first conductivity type in the pillar, the body region separating the first region from the drift region;

etching the dielectric material in the trenches to form gate trenches; and forming an insulated gate member in each of the gate trenches, the gate member being disposed adjacent to and insulated from the body region.

22. The method of claim 21 wherein the first region comprises a source, the gate comprises a gate, and the drift region comprises an extended drain region of a field-effect transistor of the power transistor device, the first region also comprising a collector and the substrate comprising an emitter, of a bipolar transistor of the power transistor device.

23. The method of claim 21 wherein the trenches extend in the vertical direction into the substrate.

24. The method of claim 21 wherein the second lateral width is approximately 2 μm.

25. The method of claim 21 wherein the first lateral width is approximately 2 μm.

26. The method of claim 21 wherein only the dielectric material is present in the trenches adjacent the drift region.

* * * * *